US007880228B2

(12) United States Patent
Yasutake

(10) Patent No.: US 7,880,228 B2
(45) Date of Patent: Feb. 1, 2011

(54) SEMICONDUCTOR DEVICE INCLUDING MISFET

(75) Inventor: Nobuaki Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/723,251

(22) Filed: Mar. 12, 2010

(65) Prior Publication Data

US 2010/0244154 A1    Sep. 30, 2010

Related U.S. Application Data

(62) Division of application No. 11/673,278, filed on Feb. 9, 2007, now abandoned.

(30) Foreign Application Priority Data

Feb. 13, 2006  (JP)  ............... 2006-034916

(51) Int. Cl.
    *H01L 21/02* (2006.01)
(52) U.S. Cl. ............... 257/344; 257/408; 257/E29.266; 257/E29.267; 257/E29.269; 438/285
(58) Field of Classification Search ............... 257/289, 257/344, 408, E29.266, E29.267, E29.269; 438/285
    See application file for complete search history.

(56) References Cited

U.S. PATENT DOCUMENTS

| 4,692,348 A | 9/1987 | Rubloff et al. |
| 6,048,756 A | 4/2000 | Lee et al. |
| 6,479,358 B1 | 11/2002 | Yu |
| 6,815,770 B1 * | 11/2004 | Chien et al. ............... 257/344 |
| 2004/0132249 A1 * | 7/2004 | Mitsuda et al. ............. 438/260 |
| 2006/0270133 A1 | 11/2006 | Yasutake |

OTHER PUBLICATIONS

P.R. Chidambaram et al., "35% Drive Current Improvement from Recessed-SiGe Drain Extensions on 37 nm Gate Length PMOS", 2004 Symposium on VLSI Technology Digest of Technical Papers, pp. 48-49.

N. Yasutake, U.S. PTO Final Office Action, U.S. Appl. No. 11/673,278, dated Dec. 15, 2009.

N. Yasutake, U.S. PTO Office Action, U.S. Appl. No. 11/673,278, dated Aug. 21, 2009.

\* cited by examiner

*Primary Examiner*—Eugene Lee
*Assistant Examiner*—Tucker Wright
(74) *Attorney, Agent, or Firm*—Foley & Lardner LLP

(57) ABSTRACT

A semiconductor device includes a semiconductor substrate, a gate insulating film, a gate electrode, a source/drain layer, and a germanide layer. The gate insulating film is formed on the semiconductor substrate. The gate electrode is formed on the gate insulating film. The source/drain layer is formed on both sides of the gate electrode, contains silicon germanium, and has a germanium layer in a surface layer portion. The germanide layer is formed on the germanium layer of the source/drain layer.

9 Claims, 12 Drawing Sheets

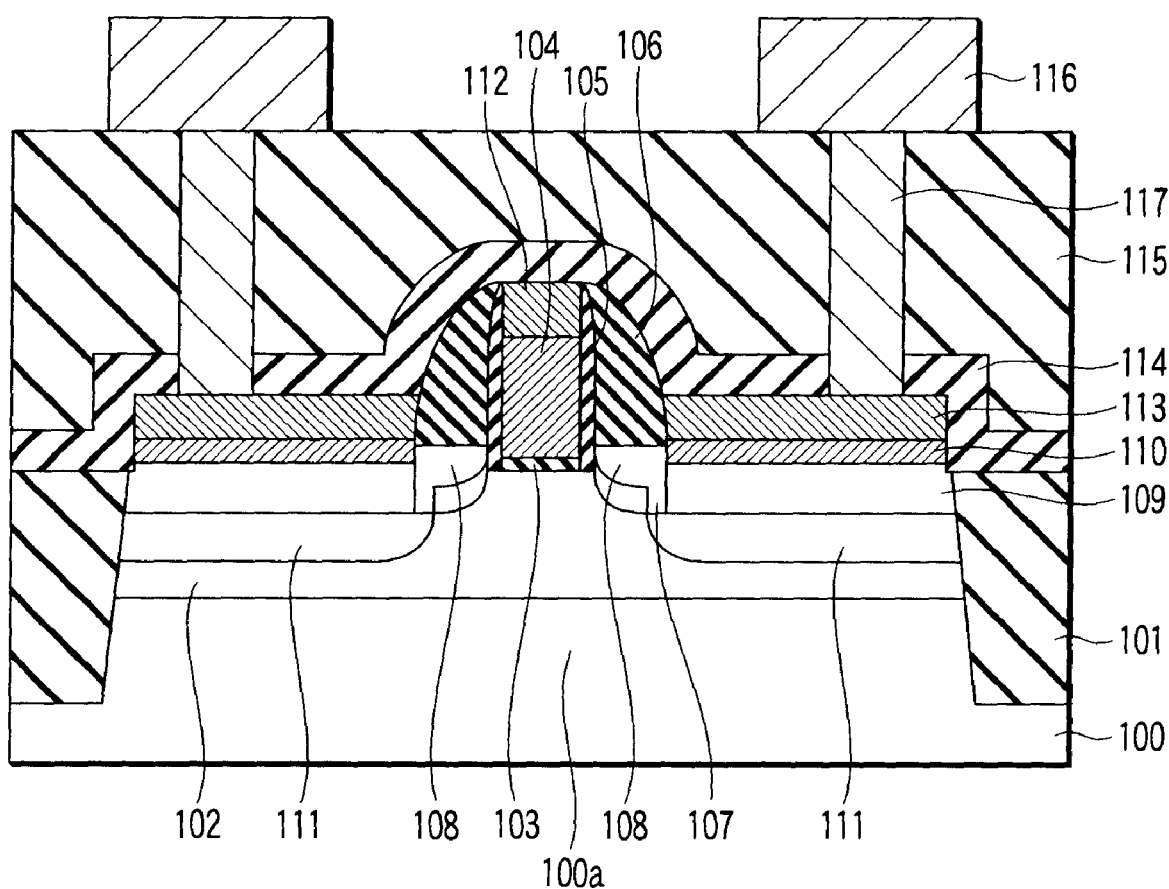
F I G. 10

SEMICONDUCTOR DEVICE INCLUDING MISFET

CROSS-REFERENCE TO RELATED APPLICATIONS

This application is a Divisional of U.S. Application Ser. No. 11/673,278, filed Feb. 9, 2007 now abandoned, which is based upon and claims the benefit of priority from prior Japanese Patent Application No. 2006-034916, filed Feb. 13, 2006, the entire contents of which are incorporated herein by reference.

BACKGROUND OF THE INVENTION

1. Field of the Invention

The present invention relates to a semiconductor device, and more particularly to an MISFET (Metal Insulator Semiconductor Field Effect Transistor)

2. Description of the Related Art

In recent years, with miniaturization of semiconductor devices, an increase in speed of an MISFET has attracted attention. For example, in a CMOSFET (Complementary MOS Field Effect Transistor), a carrier (hole) mobility in a channel region of a p-channel MOSFET (which will be referred to as a pMOS hereinafter) is slower than a carrier (electron) mobility in a channel region of an n-channel MOSFET (which will be referred to as an nMOS hereinafter), and hence increasing a speed of the pMOS is demanded.

On the other hand, in the pMOS, it is known that using a silicon germanium as a compound of silicon and germanium having a larger atomic radius than silicon for a source/drain layer provides a compression stress to a channel region and improves a carrier mobility, and that forming a silicide film on the source/drain layer of silicon germanium can reduce a resistance of the source/drain layer (see, e.g., P. R. Chidambaram et. al.; "35% Drive Current Improvement from Recessed-SiGe Drain Extension on 37 nm Gate Length PMOS", 2004 Symposium on VLSI Technology Digest of Technical Papers, pp. 48-49).

In this conventional technology, however, when forming the silicide film on the source/drain layer, since the silicon germanium and the silicide film have poor affinity, an increase in a junction leakage current or a contact failure may possibly occur. That is, when, e.g., a nickel silicide film is formed on the silicon germanium, a ternary compound of NiSiGe is formed between them. However, since this compound is thermally unstable, aggregation of Ni or deterioration in surface morphology occurs, a junction leakage current is increased, and unevenness of a contact resistance becomes considerable on, e.g., an interface of the compound and the nickel silicide film. As a result, a problem of deterioration in transistor characteristics may occur.

BRIEF SUMMARY OF THE INVENTION

According to a first aspect of the present invention, there is provided a semiconductor device comprising: a semiconductor substrate; a gate insulating film formed on the semiconductor substrate; a gate electrode formed on the gate insulating film; a source/drain layer formed on both sides of the gate electrode, the source/drain layer containing silicon germanium and having a germanium layer in a surface layer portion; and a germanide layer formed on the germanium layer of the source/drain layer.

According to a second aspect of the present invention, there is provided a semiconductor device comprising: a semiconductor substrate; a gate insulating film formed on the semiconductor substrate; a gate electrode formed on the gate insulating film; a first sidewall insulating film formed on a side surface of the gate electrode; a second sidewall insulating film formed on a side surface of the first sidewall insulating film; a first source/drain layer formed below the second sidewall insulating film, the first source/drain layer containing silicon germanium; a second source/drain layer formed in contact with the first source/drain layer on an outer side of the second sidewall insulating film, the second source/drain layer containing silicon germanium and having a germanium layer in a surface layer portion; and a germanide layer formed on the germanium layer of the second source/drain layer.

According to a third aspect of the present invention, there is provided a semiconductor device comprising: a semiconductor substrate; a first silicon germanium layer formed on the semiconductor substrate; a second silicon germanium layer formed on the semiconductor substrate apart from the first silicon germanium layer; a gate insulating film formed on the semiconductor substrate between the first silicon germanium layer and the second silicon germanium layer; a gate electrode formed on the gate insulating film; a first germanium layer formed on the first silicon germanium layer; a first germanide layer formed on the first germanium layer; a second germanium layer formed on the second silicon germanium layer; and a second germanide layer formed on the second germanium layer.

BRIEF DESCRIPTION OF THE SEVERAL VIEWS OF THE DRAWING

FIG. 10 is a cross-sectional view showing a semiconductor device according to Embodiment 2 of the present invention;

DETAILED DESCRIPTION OF THE INVENTION

A semiconductor device and a manufacturing method thereof according to embodiments of the present invention will now be explained hereinafter with reference to the accompanying drawings.

Embodiment 1

Figure 1:
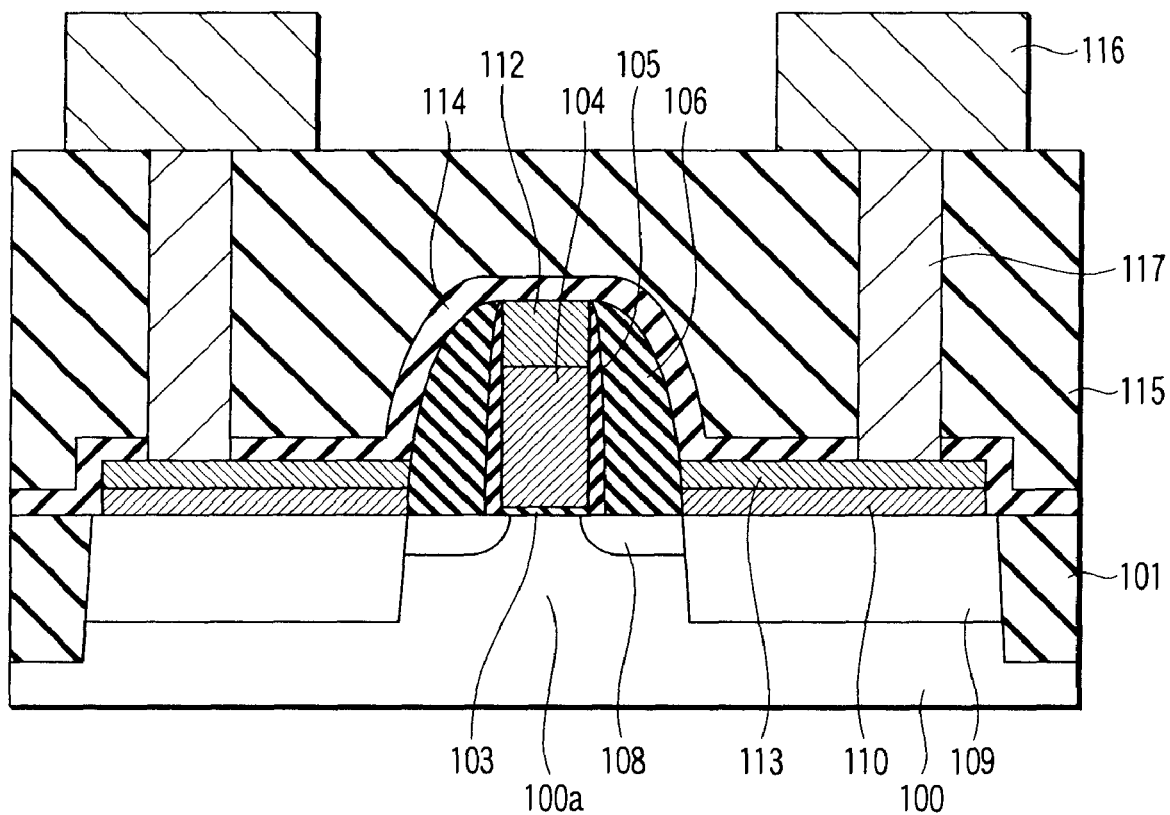
FIG. 1 is a cross-sectional view showing a semiconductor device according to Embodiment 1 of the present invention.

First, referring to FIG. 1, a structure of a semiconductor device according to Embodiment 1 of the present invention will be explained. FIG. 1 is a cross-sectional view showing a semiconductor device according to this embodiment that functions as a pMOS of a CMOSFET.

As shown in FIG. 1, an element isolating region 101 is provided in a semiconductor substrate, e.g., a single-crystal silicon semiconductor substrate (which will be referred to as a silicon substrate hereinafter) 100, and an element forming region 100a is partitioned by this element isolating region 101. A gate electrode 104 is formed on the silicon substrate 100 via a gate insulating film 103. A first sidewall insulating film 105 is formed on a side surface of the gate electrode 104, and a second sidewall insulating film 106 is formed on a side surface of the first sidewall insulating film 105.

Further, a first source/drain layer 108 as an extension layer in which a p-type impurity ion is implanted is formed on the silicon substrate 100 below the second sidewall insulating film 106.

A silicon germanium layer 109 is formed on the silicon substrate 100 on each of both sides (an outer side) of the second sidewall insulating film 106, and a germanium layer 110 is formed on the silicon germanium layer 109. Furthermore, a second source/drain layer in which a p-type impurity ion is implanted is formed on the silicon germanium layer 109 and the germanium layer 110. When the second source/drain layer contains the silicon germanium in this manner, a compression stress can be given to a channel region to increase a mobility of a carrier.

Moreover, in order to reduce resistances of the gate electrode 104 and the second source/drain layer, a silicide layer 112 is formed on an upper side of the gate electrode 104, and a germanide layer 113 is formed on the germanium layer 110 of the second source/drain layer. This germanide layer 113 is formed by forming a high-melting point metal film of, e.g., nickel (Ni), cobalt (Co), titanium (Ti), iridium (Ir), platinum (Pt), or palladium (Pd) on the germanium layer 110 of the second source/drain layer, and then performing a heat treatment to react the germanium layer 110 with the high-melting point metal film. The germanide layer 113 is constituted of a binary compound, e.g., NiGe, CoGe, TiGe, IrGe, PtGe, or $Pd_2Ge$ without containing Si.

Additionally, a barrier insulating film 114 is formed on the element isolating region 101, the gate electrode 104, the sidewall insulating films 105 and 106, and the germanide layer 113. An interlayer insulating layer 115 is formed on the barrier insulating film 114. Further, a wiring layer 116 is formed on the interlayer insulating layer 115. The wiring layer 116 is electrically connected with the germanide layer 113 via a contact plug 117.

A manufacturing method of a semiconductor device according to Embodiment 1 will now be explained with reference to FIGS. 2 to 8. FIGS. 2 to 8 are process cross-sectional views showing a manufacturing method of the semiconductor device according to Embodiment 1. It is to be noted that the element isolating region 101 is not depicted and omitted in FIGS. 2 and 8.

First, the element isolating region 101 is formed in the silicon substrate 100. As the element isolating region 101, it is possible to use so-called STI (shallow trench isolation) obtained by forming a shallow groove in the silicon substrate 100 by a photo engraving process and filling this groove with an insulating film, e.g., an silicon oxide film (an $SiO_2$ film) formed by a CVD (Chemical vapor deposition) method.

Figure 2:
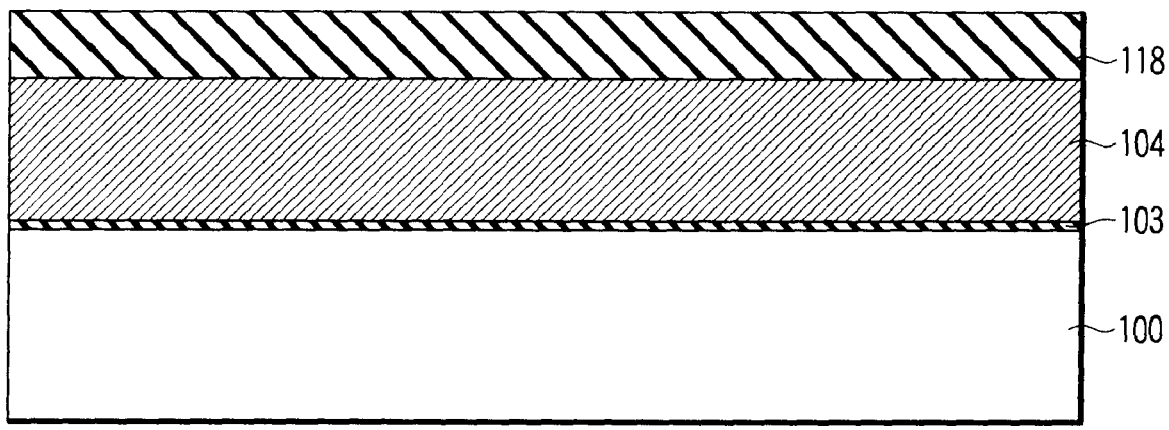
FIGS. 2 to 8 are cross-sectional views showing a manufacturing method of a semiconductor device according to Embodiment 1.

Furthermore, as shown in FIG. 2, the gate insulating film 103 having, e.g., an $SiO_2$ film or a silicon oxynitride film (an SiON film) as a material is formed on the silicon substrate 100 by using the CVD method or the like. An electroconductive material film, e.g., a polycrystal silicon film, in which, e.g., boron (B) is added at a high concentration, serving as the gate electrode 104 is deposited on the gate insulating film 103. Moreover, an oxide film 118, e.g., an $SiO_2$ film formed by the CVD method is deposited on the polycrystal silicon film.

Figure 3:
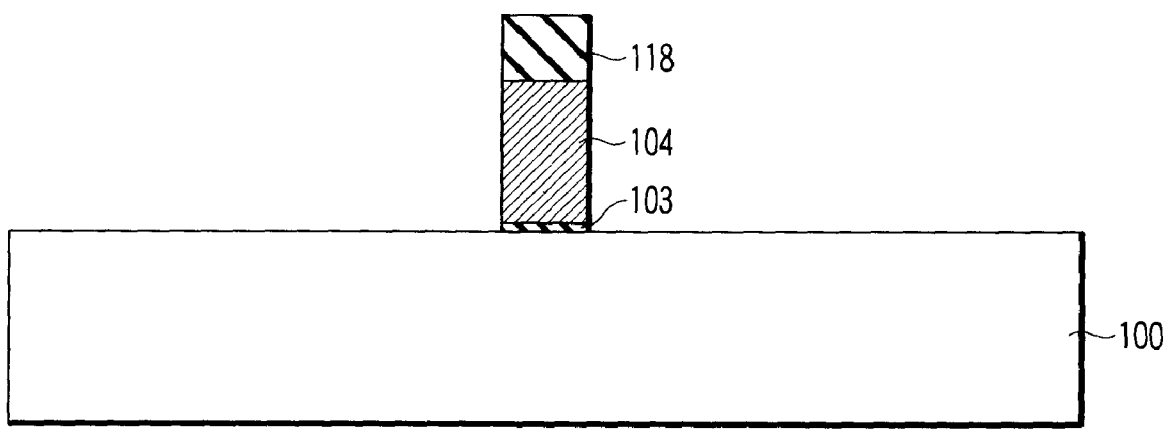

Then, as shown in FIG. 3, a gate electrode pattern is processed on the oxide film 118 by lithography and etching, and then the polycrystal silicon film is etched with this oxide film 118 being used as a mask, thereby forming the gate electrode 104. Additionally, the gate insulating film 103 is etched and removed while avoiding a part below the gate electrode 104.

Figure 4:
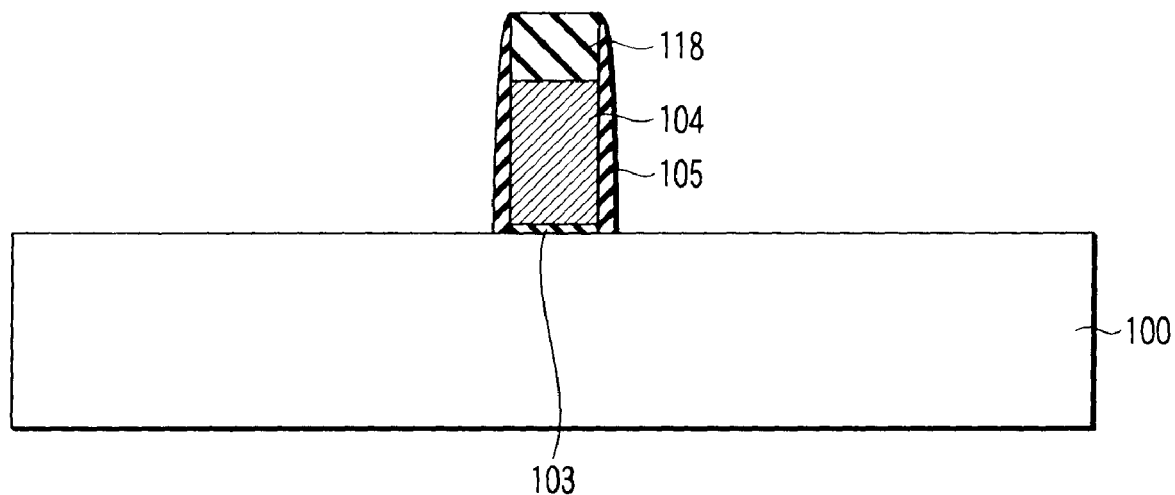

Subsequently, a silicon nitride film (an SiN film) having a film thickness of, e.g., 10 nm is formed on the silicon substrate 100 and the gate electrode 104 by the CVD method and the like. Further, the silicon nitride film formed on the gate electrode 104, the silicon substrate 100, and others is subjected to anisotropic etched to form the first sidewall insulating film 105 on the side surface of the gate electrode 104 as shown in FIG. 4.

Figure 5:
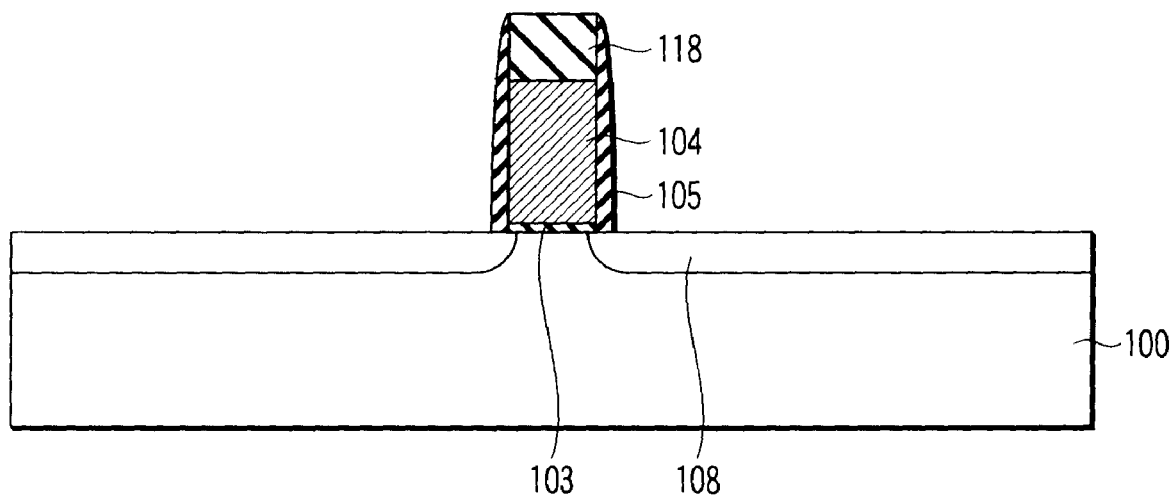

Then, as shown in FIG. 5, the first source layer 108 as the extension layer is formed on the silicon substrate 100 on both sides of the first sidewall insulating film 105. In order to realize this structure, a p-type impurity ion is implanted into the silicon substrate 100 with the gate electrode 104 and the first sidewall insulating film 105 being used as a mask. As the impurity ion to be implanted, boron (B) can be used, for example.

Figure 6:
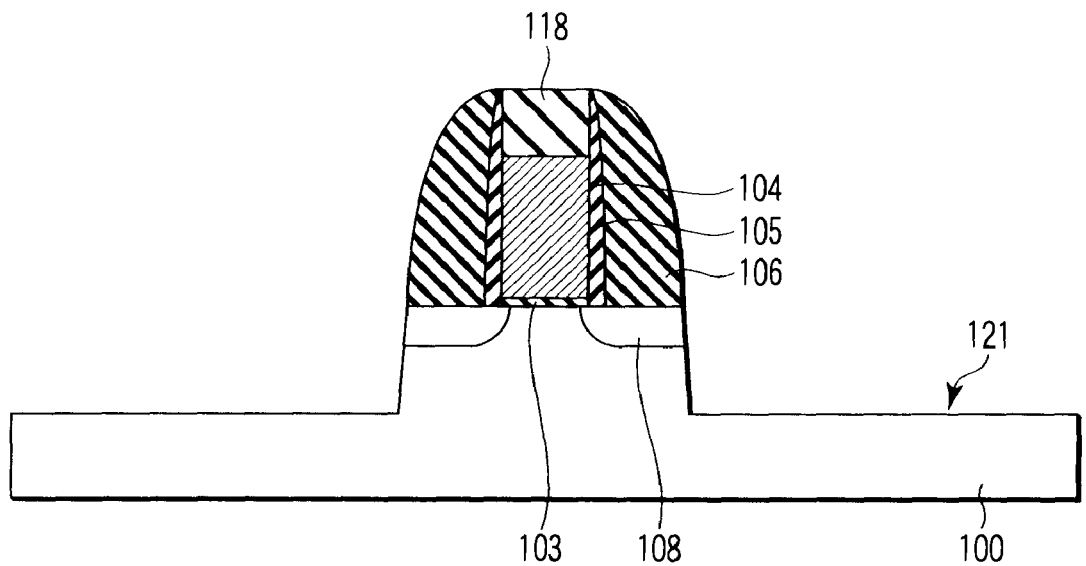

Subsequently, a silicon nitride film (an SiN film) or a silicon oxide film (an $SiO_2$ film) having a film thickness of, e.g., 20 to 30 nm is formed on the silicon substrate 100, the gate electrode 104, and the first sidewall insulating film 105 by the CVD method and the like. Then, the silicon nitride film or the silicon oxide film formed on the gate electrode 104 and the silicon substrate 100 is subjected to anisotropic etching. As a result, the second sidewall insulating film 106 is formed on the first sidewall insulating film 105 on the side surface of the gate electrode 104 as shown in FIG. 6. Furthermore, a surface portion of the silicon substrate 100 is etched to be removed with the gate electrode 104 and the second sidewall insulating film 106 being used as a mask, thereby forming a shallow groove 121 for the second source/drain layer serving as a source/drain layer. It is to be noted that the upper surface of the gate electrode 104 is covered with the oxide film 118 at the time of this etching, and hence the gate electrode 104 is not etched.

Figure 7:
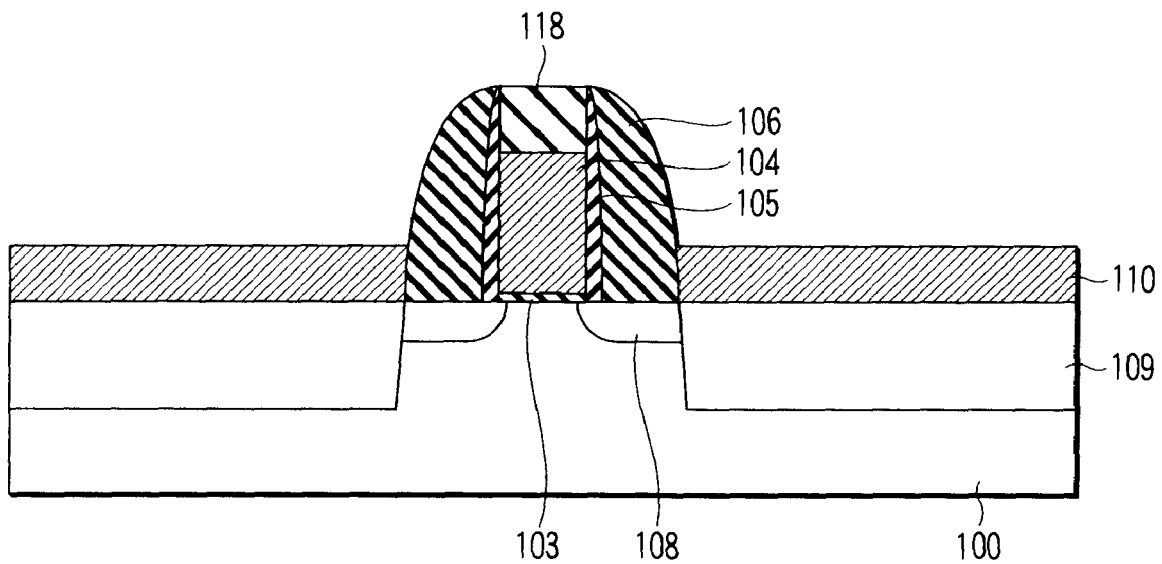

Subsequently, as shown in FIG. 7, the silicon germanium layer 109 and the germanium layer 110 are sequentially subjected to selective epitaxial growth on the groove 121. This selective epitaxial growth of the silicon germanium layer 109 can be realized by adding, e.g., approximately 0.4 vol % to 0.5 vol % of hydrogen chloride (HCl) to hydrogen ($H_2$) as a carrier gas and using a mixed gas containing dichlorsilane ($SiH_2Cl_2$) and monogermane ($Ge_4$) as a raw material at a temperature of, e.g., 650° C. to 750° C. A gas flow rate of $GeH_4$ with respect to $SiH_2Cl_2$ can be set to, e.g., 2 vol % to 5 vol %. Changing this gas flow ratio enables controlling a germanium concentration in the silicon germanium layer 109 to a desired value.

In this embodiment, a germanium concentration in this silicon germanium layer 109 is determined to fall within a range of, e.g., 10 at % to 30 at % in order to give a compression stress to the channel region and effectively improve a carrier mobility by containing the germanium and also to suppress an influence of occurrence of a crystal defect due to excessively containing the germanium. Furthermore, a thickness of the silicon germanium layer 109 can be changed in dependence on a gate length. When the gate length is, e.g., 70 nm, a thickness of the silicon germanium layer 109 can be set to, e.g., 35 nm to 40 nm. However, this value can be increased to enlarge a compression stress given to the channel region. Moreover, after growing the silicon germanium layer 109, a gas flow ratio at the time of selective epitaxial growth of the silicon germanium layer 109, i.e., a gas flow rate of GeH$_4$ with respect to SiH$_2$Cl$_2$ can be greatly increased, thereby subjecting the germanium layer 110 to selective epitaxial growth on the silicon germanium layer 109. At this time, for example, as explained above, growth is effected in such a manner that a germanium concentration of the silicon germanium layer 109 becomes 10 at % to 30 at %, and growth is performed in such a manner that a germanium concentration of the germanium layer 110 becomes approximately 100 at %.

Additionally, in order to form the second source/drain layer on both sides of the second sidewall insulating film 106, a boron (B) ion or the like is implanted into the silicon germanium layer 109 and the germanium layer 110 with the gate electrode 104 and the second sidewall insulating film 106 being used as a mask. Ion implantation conditions of the second source/drain layer are a higher energy and a higher concentration than those in ion implantation of the first source/drain layer 108. As a result, a junction depth of the second source/drain layer can be formed larger than a junction depth of the first source/drain layer 108 as the extension layer. Here, the second source/drain layer is formed in contact with the first source/drain layer 108. It is to be noted that the second source/drain layer may be formed to be deeper than the silicon germanium layer 109.

Figure 8:
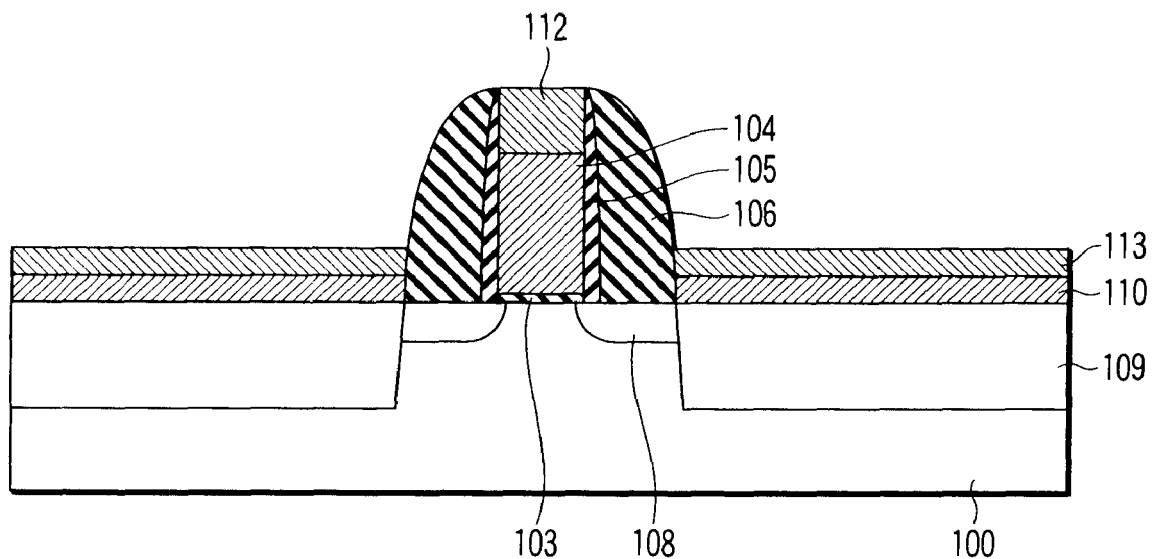

Then, the oxide film 118 on the gate electrode 104 is removed by, e.g., wet etching to expose a surface of the polycrystal silicon layer of the gate electrode 104. Subsequently, as shown in FIG. 8, the silicide layer 112 is formed on the gate electrode 104, and the germanide layer 113 is formed on the second source/drain layer, i.e., the germanium layer 110. In more detail, a metal film (not shown) is formed on the gate electrode 104 and the germanium layer 110 by, e.g., sputtering. Thereafter, a heat treatment is carried out to react the polycrystal silicon layer provided on the surface of the gate electrode 104 with the metal film, thereby forming the silicide layer 112 on the gate electrode 104. Additionally, the germanium layer 110 at the surface layer portion of the second source/drain layer is reacted with the metal film, thereby forming the germanide layer 113 on the second source/drain layer. At this time, the second source/drain layer has the germanium layer 110 on an interface between itself and the germanide layer 113. Further, as a metallic material of the metal film, it is possible to use a high-melting point metal, e.g., nickel (Ni), cobalt (Co), titanium (Ti), iridium (Ir), platinum (Pt), or palladium (Pd). Thereafter, an unreacted metal film other than the silicide layer 112 and the germanide layer 113 is removed.

Then, as shown in FIG. 1, the barrier insulating film 114 is deposited on the structure depicted in FIG. 8. Subsequently, the interlayer insulating layer 115 is deposited on the barrier insulating film 114 and flattened by, e.g., CMP (Chemical Mechanical Polishing). Furthermore, a contact hole reaching the germanide layer 113 is formed in the interlayer insulating layer 115, and then the contact hole is filled with an electro-conductive material to form the contact plug 117. Moreover, the wiring layer 116 connected with the contact plug 117 is formed on the interlayer insulating layer 115. Thereafter, a process required for a semiconductor device, e.g., multilayer wiring is carried out, thus manufacturing the semiconductor device according to this embodiment.

According to the semiconductor device of this embodiment, since the second source/drain layer contains the silicon germanium as a compound of silicon and germanium having a larger atomic radium than silicon, a compression stress can be given to the channel region, and a carrier mobility can be improved.

Additionally, in a conventional technology, a silicide layer is formed on a source/drain layer using the silicon germanium in order to reduce a resistance of the source/drain layer. However, when the silicide layer directly comes into contact with the silicon germanium in the source/drain layer, a thermally unstable compound is generated. As a result, transistor characteristics may be deteriorated in some cases. Further, even if a surface layer of the source/drain layer containing the silicon germanium is constituted of a silicon layer having a fixed thickness and the silicide layer is formed on this silicon layer along to suppress generation of a compound due to reaction of the silicon germanium and the silicide layer, a contact resistance between the silicon layer and the silicide layer is increased, and hence an improvement in transistor characteristics may possibly become insufficient.

On the other hand, in the semiconductor device according to this embodiment, in order to reduce a resistance of the second source/drain layer, the surface layer of the second source/drain layer using the silicon germanium is constituted of the germanium layer 110 having a fixed thickness, and the germanide layer 113 is provided on the germanium layer 110 to prevent reaching the silicon germanium layer 109. As a result, the silicon germanium layer 109 of the second source/drain layer does not directly come into contact with the germanide layer 113, and a thermally unstable compound is not generated. Therefore, deterioration in transistor characteristics can be avoided. Further, since a contact resistance between the germanium layer 110 and the germanide layer 113 is lower than a contact resistance between the silicon layer and the silicide layer, thus effectively suppressing deterioration in transistor characteristics.

Therefore, according to the semiconductor device of this embodiment, a compression stress can be given to the channel region, a carrier mobility can be improved, and a resistance of the source/drain layer can be reduced without generating a thermally unstable compound on the source/drain layer. As a result, deterioration in transistor characteristics can be suppressed.

Figure 9:
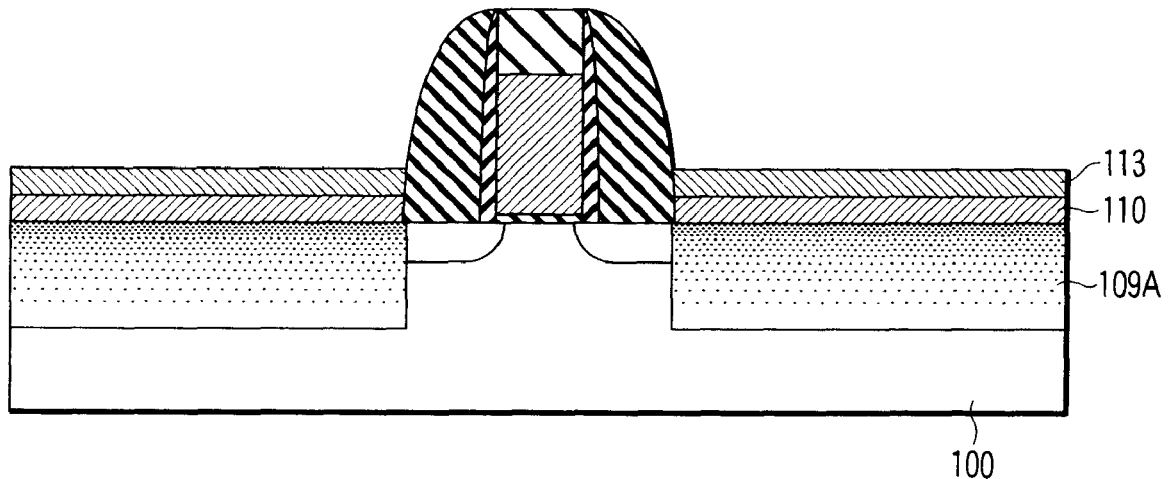
FIG. 9 is a process cross-sectional view of a semiconductor device according to a modification of Embodiment 1.

It is to be noted that the germanium layer 110 is formed on the silicon germanium layer 109 having a predetermined germanium concentration in this embodiment. However, as shown in FIG. 9, a silicon germanium layer 109A whose germanium concentration continuously varies from the surface layer portion toward the deep layer portion may be used, and the germanium layer 110 may be formed on this silicon germanium layer 109A. In this example, the germanium concentration in a lower part of the silicon germanium layer 109A is set to 10 to 30 at %. The germanium concentration in the interface between the silicon germanium layer 109A and the germanium layer 110 is set to 100 at %.

An effect of reducing a resistance of the source/drain layer in this embodiment will now be explained. In this embodiment, the germanide layer is formed on the germanium layer in the source/drain layer. A contact resistance between the germanium layer and the germanide layer in this example can be represented by the following Expression (1).

$$\rho_C \propto \exp\left(\frac{\phi_B}{\sqrt{N_D}}\right) \quad (1)$$

In Expression (1), $\rho_C$ is a contact resistance between the germanium layer and the germanide layer, and $N_D$ is an impurity concentration in an interface, i.e., a boron ion concentration in an interface between the germanium layer and the germanide layer. Furthermore, $\phi_B$ is a height of a Schottky barrier.

When NiGe is formed as the germanide layer on the germanium layer, $\phi_B$=0.2 eV is achieved. Likewise, when PtGe is formed as the germanide layer, $\phi_B$=0.05 eV is achieved. On the other hand, as a conventional technology, when NiSi is formed as the silicide layer on the silicon layer, $\phi_B$=0.43 eV is attained. Likewise, PtSi is formed as the silicide layer on the same, $\phi_B$=0.20 to 0.24 eV is achieved. When $Pd_2Si$ is formed as the silicide layer, $\phi_B$=0.35 eV is attained. Moreover, when the silicon germanium layer is used in the source/drain layer and NiSi, PtSi, or $Pd_2Si$ is formed on the silicon germanium layer, $\phi_B$ is reduced by approximately 0.1 eV and becomes 0.33 eV, 0.10 to 0.14 eV, or 0.25 eV. It is to be noted that a germanium concentration of the silicon germanium layer in this example is 15 at %. Therefore, as compared with the conventional technology where the silicide film is formed on the silicon layer or the silicon germanium layer, the contact resistance in the source/drain layer can be reduced in this embodiment where the germanide layer is formed on the germanium layer on the silicon germanium layer.

Embodiment 2

A structure of a semiconductor device according to Embodiment 2 of the present invention will be first explained with reference to FIG. 10. FIG. 10 is a cross-sectional view showing a semiconductor device according to this embodiment that functions as a pMOS of a CMOSFET.

As shown in FIG. 10, an element isolating region 101 is provided in a single-crystal silicon semiconductor substrate (a silicon substrate) 100, and an n-type well region 102 having an n-type impurity ion is formed in an element forming region 100 partitioned by this element isolating region 101. A gate insulating film 103 is formed on the n-type well region 102 of the silicon substrate 100, and a gate electrode 104 is formed on the gate insulating film 103. A first sidewall insulating film 105 is formed on a side surface of the gate electrode 104, and a second sidewall insulating film 106 is formed on a side surface of the first sidewall insulating film 105.

Additionally, a semiconductor layer 107 is formed in the n-type well region 102 below the second sidewall insulating film 106. Further, a first source/drain layer 108 as an extension layer in which a p-type impurity ion is implanted is formed on this semiconductor layer 107. Here, it is preferable for the semiconductor layer 107 to be a semiconductor layer containing silicon germanium in order to give a compression stress to a channel region and improve a mobility of a carrier. Furthermore, it is preferable for the first source/drain layer 108 to be formed with a so-called elevated structure in which a surface thereof is placed above a surface of the silicon substrate 100 where a channel moves.

A silicon germanium layer 109 is formed on the n-type well region 102 on both sides (an outer side) of the second sidewall insulating film 106. A germanium layer 110 is formed on the silicon germanium layer 109. Moreover, a second source/drain layer 111 in which a p-type impurity ion is implanted is formed in this silicon germanium layer 109 and the germanium layer 110. When the silicon germanium is contained in the second source/drain layer 111 in this manner, a compression stress can be given to a channel region, and a mobility of a carrier can be increased. Additionally, in this example, like the first source/drain layer 108, in order to suppress a short channel effect, it is preferable for the second source/drain layer 111 to be formed with the elevated structure in which a surface thereof is formed at a higher position than a height of the surface of the silicon substrate 100.

Further, in order to reduce resistances of the gate electrode 104 and the second source/drain layer 111, a silicide layer 112 is formed on the gate electrode 104, and a germanide layer 113 is formed on the germanium layer 110 of the second source/drain layer 111. This germanide layer 113 is formed by forming a high-melting point metal film of, e.g., nickel (Ni), cobalt (Co), titanium (Ti), iridium (Ir), platinum (Pt), or palladium (Pd) on the germanium layer 110 of the second source/drain layer 111, and then carrying out a heat treatment to react the germanium layer 110 of the second source/drain layer 111 with the high-melting point metal film. The germanide layer 113 is constituted of a binary compound, e.g., NiGe, CoGe, TiGe, IrGe, PtGe, or $Pd_2Ge$ without containing Si.

Furthermore, a barrier insulating film 114 is formed on the element isolating region 101, the gate electrode 104, the sidewall insulating films 105 and 106, and the germanide layer 113. An interlayer insulating layer 115 is formed on the barrier insulating film 114. Moreover, a wiring layer 116 is formed on the interlayer insulating layer 115. The wiring layer 116 is electrically connected with the germanide layer 113 via a contact plug 117.

A manufacturing method of a semiconductor device according to this embodiment will now be explained with reference to FIGS. 11A to 13B. FIGS. 11A to 13B are process cross-sectional views showing the manufacturing method of a semiconductor device according to this embodiment.

Figure 11A:
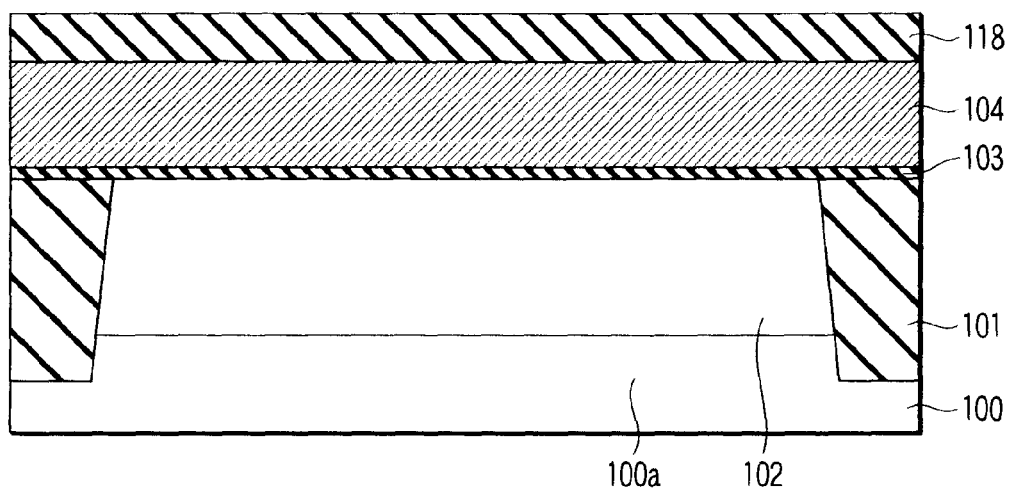
FIGS. 11A, 11B, 11C, 12A, 12B, 12C, 13A, and 13B are cross-sectional views showing a manufacturing method of the semiconductor device according to Embodiment 2.

First, as shown in FIG. 11A, the element isolating region 101 is formed in the silicon substrate 100. As the element isolating region 101, it is possible to use so-called STI (shallow trench isolation) obtained by forming a shallow groove in the silicon substrate 100 by a photo engraving process and filling this groove with a silicon oxide film (an $SiO_2$ film) formed by, e.g., a CVD (Chemical vapor deposition) method. Additionally, an n-type impurity ion is implanted into the element forming region 100a of the silicon substrate 100, and a heat treatment is carried out to form the n-type well region 102. Further, the gate insulating film 103 having, e.g., an $SiO_2$ film or a silicon oxynitride film (an SiON film) as a material is formed on the silicon substrate 100 and the element isolating region 101 by using the CVD method and the like. An electroconductive material film serving as the gate electrode 104, e.g., a polycrystal silicon film having boron (B) added therein with a high concentration is deposited on the gate insulating film 103. Furthermore, an oxide film 118, e.g., an $SiO_2$ film formed by the CVD method is deposited on the polycrystal silicon film.

Figure 11B:
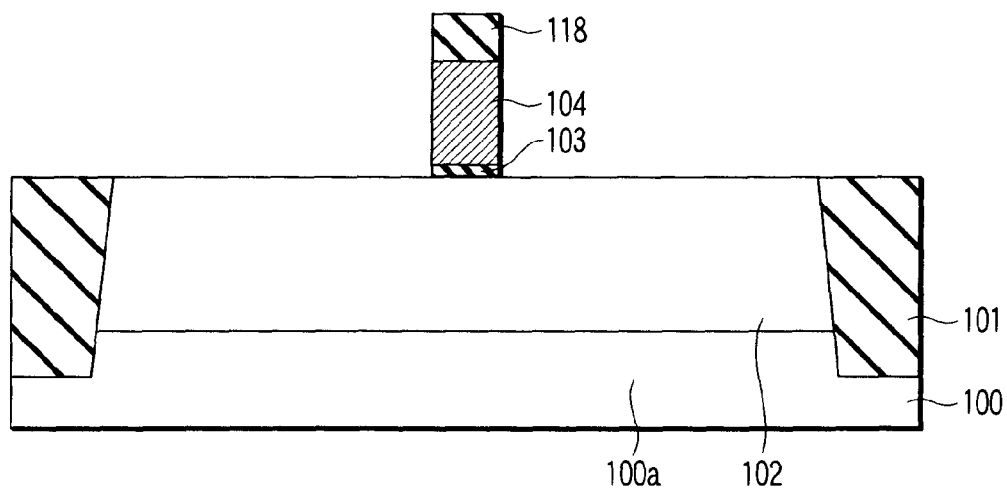

Then, as shown in FIG. 11B, a gate electrode pattern is processed on the oxide film 118 by lithography and etching. Thereafter, this oxide film 118 is used as a mask to etch the polycrystal silicon film, thereby forming the gate electrode 104. Moreover, the gate insulating film 103 is etched to be removed except a part below the gate electrode 104.

Figure 11C:
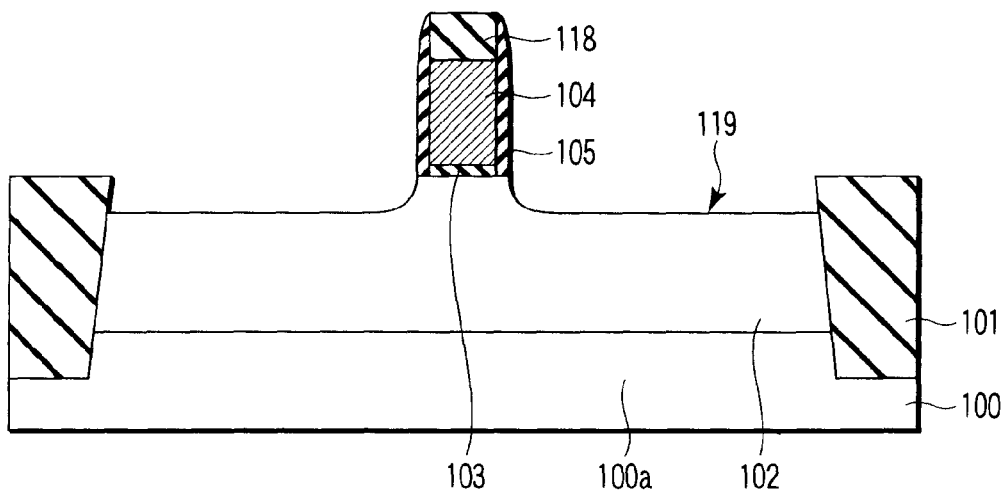

Subsequently, as shown in FIG. 11C, a silicon nitride film (an SiN film) having a film thickness of, e.g., 10 nm is formed on the element isolating region 101, the silicon substrate 100, and the gate electrode 104 by the CVD method and the like. Additionally, the silicon nitride film formed on the gate electrode 104, the silicon substrate 100, and others is subjected to anisotropic etching, thus forming the first sidewall insulating film 105 on the side surface of the gate electrode 104. Further, a surface portion of the silicon substrate 100 is etched to be removed with the gate electrode 104 and the first sidewall insulating film 105 being used as a mask, thereby forming a shallow groove 119 for the first source/drain layer 108 serving as an extension layer. During the etching, the gate electrode 104 is not etched since the oxide film 118 covers the upper surface of the gate electrode 104.

Figure 12A:
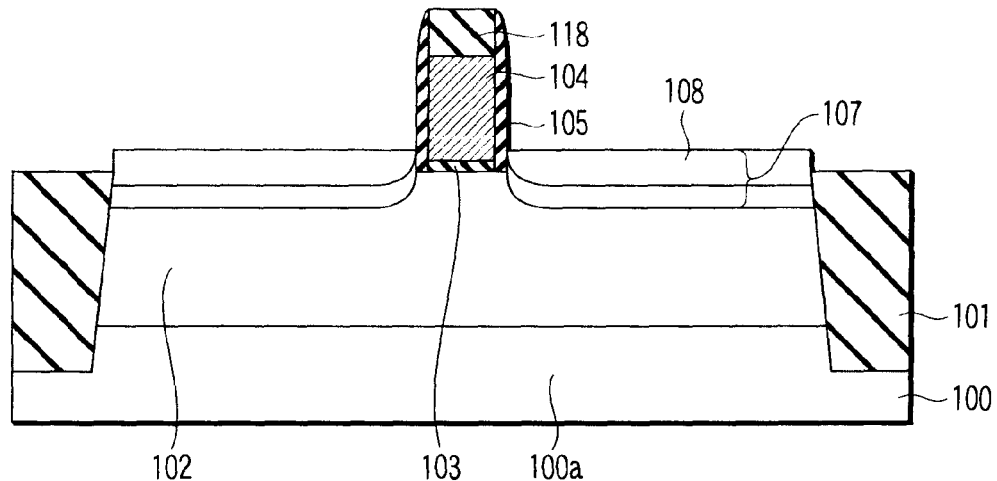

Then, as shown in FIG. 12A, the semiconductor layer 107, e.g., a silicon germanium layer is subjected to selective epitaxial growth on the groove 119. This selective epitaxial growth of the silicon germanium layer 107 can be realized by adding, e.g., approximately 0.4 vol % to 0.5 vol % of hydrogen chloride (HCl) to hydrogen ($H_2$) as a carrier gas and using a mixed gas containing dichlorsilane ($SiH_2Cl_2$) and monogermane ($GeH_4$) as a raw material at a temperature of, e.g., 650° C. to 750° C. A gas flow rate of $GeH_4$ with respect to $SiH_2Cl_2$ can be set to, e.g., 2 vol % to 5 vol %. Varying this gas flow ratio enables controlling a germanium concentration in the silicon germanium layer 107 to a desired value. In this embodiment, the germanium concentration in this silicon germanium layer 107 is determined to fall within a range of, e.g., 10 at % to 30 at % in order to give a compression stress to the channel region and effectively improve a carrier mobility based on containing germanium, and also to suppress an influence of occurrence of a crystal defect due to excessively containing germanium.

Furthermore, a thickness of the silicon germanium layer 107 can be changed in dependence on a gate length. When the gate length is, e.g., 70 nm, a thickness of the silicon germanium layer 107 can be set to, e.g., 35 nm to 40 nm. However, this value can be increased to enlarge a compression stress that is given to the channel region.

In the semiconductor device according to this embodiment, a surface of this silicon germanium layer 107 is set higher than that of the silicon substrate 100 in the channel region. For example, a depth of the groove 119 required to form the silicon germanium layer 107 is set to, e.g., 30 nm, and a film thickness of the silicon germanium layer 107 is set to 40 nm. When the silicon germanium layer 107 has the elevated structure in this manner, the silicon germanium layer 107 can be formed thick to improve a compression stress. Moreover, on the other hand, a later-explained effective junction depth of the first source/drain layer 108 can be reduced, thereby suppressing a short channel effect as compared with a flat structure.

Then, when, e.g., an impurity ion is implanted into the silicon germanium layer 107, the first source/drain layer 108 is formed. As an impurity that is implanted into the silicon germanium layer 107, it is possible to use, e.g., boron (B). In this example, when forming the first source/drain layer 108 based on ion implantation, adjusting an implantation energy enables controlling the junction depth. For example, as shown in FIG. 12A, the junction depth of the first source/drain layer 108 can be reduced to be smaller than a thickness of the silicon germanium layer 107. Additionally, diffusion of boron (B) in the silicon germanium layer 107 is suppressed as compared with diffusion in the silicon substrate, and hence this is advantageous to reduce the junction depth of the first source/drain layer 108 and thereby suppress the short channel effect.

Figure 12B:
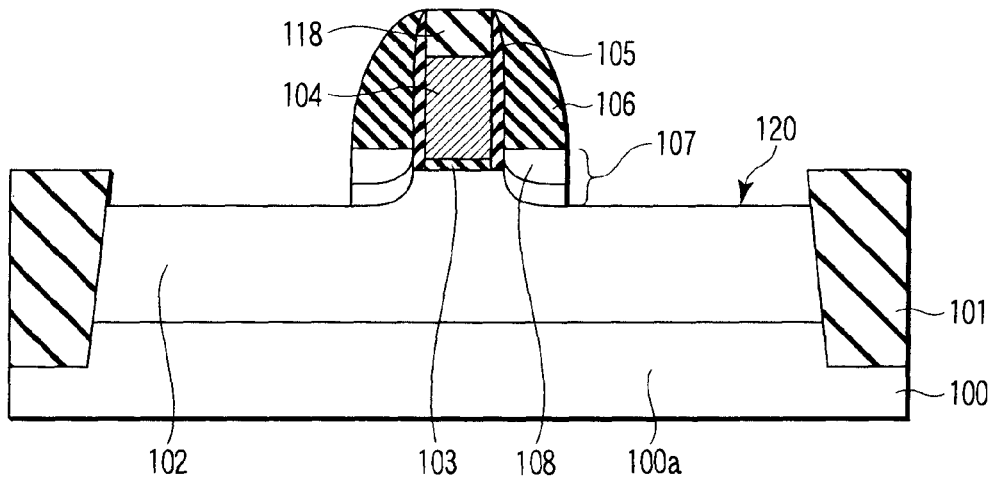

Then, as shown in FIG. 12B, an insulating film serving as the second sidewall insulating film 106, e.g., an SiN film or an $SiO_2$ film having a film thickness of 20 to 30 nm is deposited on the gate electrode 104 and the silicon germanium layer 107 by the CVD method and the like. Thereafter, the insulating film on the gate electrode 104 and the silicon germanium layer 107 is removed by anisotropic etching so that the insulating film remains on the side surface of the gate electrode 104 along, thereby forming the second sidewall insulating film 106.

Further, the gate electrode 104 and the second sidewall insulating film 106 are used as a mask to etch the exposed silicon germanium layer 107, and a groove 120 required to form the second source/drain layer 111 is thereby formed. The groove 120 can have a depth that allows removing the silicon germanium layer 107, for example. It is to be noted that an upper surface of the gate electrode 104 is covered with the oxide film 118 in this etching, and hence the gate electrode 104 is not etched. In this manner, the silicon germanium layer 107 remains below the second sidewall insulating film 106 alone, and the first source/drain layer 108 is formed below the second sidewall insulating film 106.

Figure 12C:
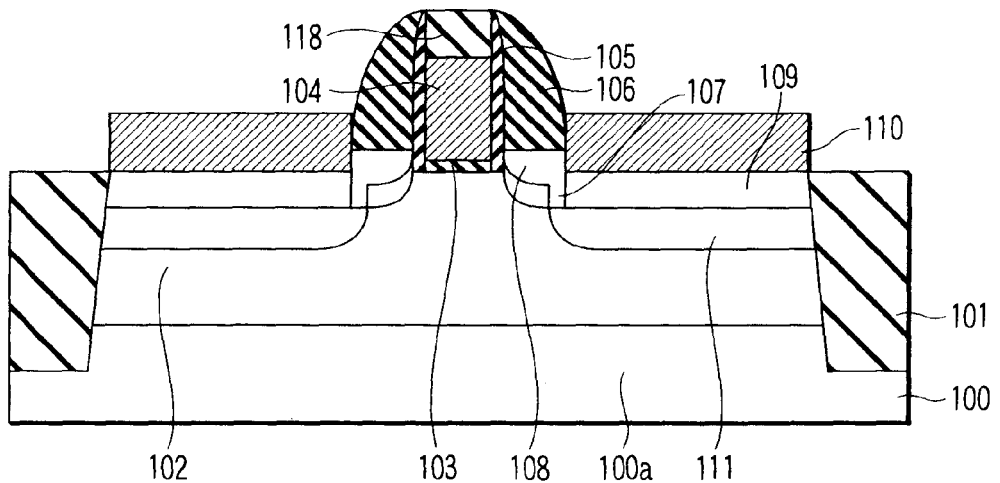

Then, as shown in FIG. 12C, the silicon germanium layer 109 and the germanium layer 110 are sequentially subjected to selective epitaxial growth in the groove 120. This selective epitaxial growth of the silicon germanium layer 109 can be carried out by adding a small amount of HCl to an $H_2$ gas as a carrier gas and using $SiH_2Cl_2$ and $GeH_4$ as a raw material gas like the above-explained selective epitaxial growth of the silicon germanium layer 107. Furthermore, the silicon germanium layer 109 is grown, and then a gas flow ratio at the time of selective epitaxial growth of the silicon germanium layer 109, i.e., a gas flow rate of $GeH_4$ with respect to $SiH_2Cl_2$ is greatly increased, thereby subjecting the germanium layer 110 to selective epitaxial growth on the silicon germanium layer 109. At this time, growth is effected in such a manner that a germanium concentration in the silicon germanium layer 109 becomes 10 at % to 30 at %, and that a germanium concentration in the germanium layer 110 becomes approximately 100 at %, for example.

A total thickness of the silicon germanium layer 109 and the germanium layer 110 is set larger than a depth of the groove 120, i.e., a thickness of the silicon germanium layer 107 in order to provide the elevated structure to the second source/drain layer 111 formed at this position in a later process. When the second source/drain layer 111 has the elevated structure in this manner, an effective junction depth of the second source/drain layer 111 can be reduced, thereby suppressing a short channel effect.

Moreover, in order to form the second source/drain layer 111 on both sides of the second sidewall insulating film 106, the gate electrode 104 and the second sidewall insulating film 106 are used as a mask to implant, e.g., a boron (B) ion into the silicon germanium layer 109 and the germanium layer 110. Ion implantation conditions of the second source/drain layer 111 are a higher energy and a higher concentration than those in ion implantation of the first source/drain layer 108. As a result, the second source/drain layer 11 can be formed to be deeper than the junction depth of the first source/drain layer 108 as extension layer. In this example, the second source/drain layer 111 is formed in contact with the first source/drain layer 108, and it may be formed to be deeper than the silicon germanium layer 109.

It is to be noted that the silicon germanium layer 107 exposed on the outer side of the second sidewall insulating film 106 is etched to form the groove 120, and then the silicon germanium layer 109 is formed in the groove 120 in this embodiment as shown in FIGS. 12B and 12C. However, when the silicon germanium layer is used for the semiconductor layer 107 like this embodiment, the silicon germanium layer 107 may be left as it is without being etched. In this case, the germanium layer 110 can be formed on the left silicon germanium layer 107 on the outer side of the second sidewall insulating film 106. Moreover, the second source/drain layer 111 may be formed on the silicon germanium layer 107 and the germanium layer 110 on the outer side of the second sidewall insulating film 106.

Figure 13A:
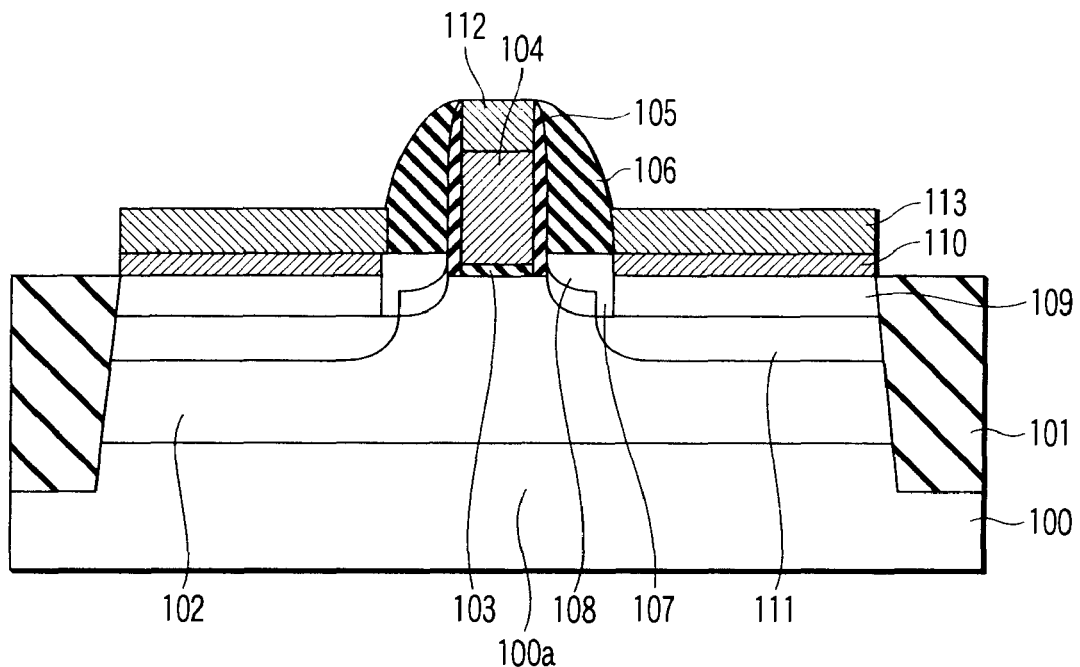

Then, as shown in FIG. 13A, the oxide film 118 on the gate electrode 104 is removed by wet etching to expose the surface of the polycrystal silicon layer of the gate electrode 104. Thereafter, the silicide layer 112 is formed on the gate electrode 104, and the germanide layer 113 is formed on the second source/drain layer 111. That is, a metal film (not shown) is deposited on the gate electrode 104 and the second source/drain layer 111 by, e.g., sputtering, and then a heat treatment is carried out to react the polycrystal silicon layer on the surface of the gate electrode with the metal film, thereby forming the silicide layer 112 on the gate electrode 104. Simultaneously, the germanium layer 110 at a surface layer portion of the second source/drain layer 111 is reacted with the metal film to form the germanide layer 113 on the second source/drain layer 111. At this time, the second source/drain layer 111 has the germanium layer 110 on an interface between itself and the germanide layer 113. Additionally, as a metallic material of the metal film, it is possible to use a high-melting point metal, e.g., nickel (Ni), cobalt (Co), titanium (Ti), iridium (Ir), platinum (Pt), or palladium (Pd). Then, an unreacted metal film other than the silicide layer 112 and the germanide layer 113 is removed.

Figure 13B:
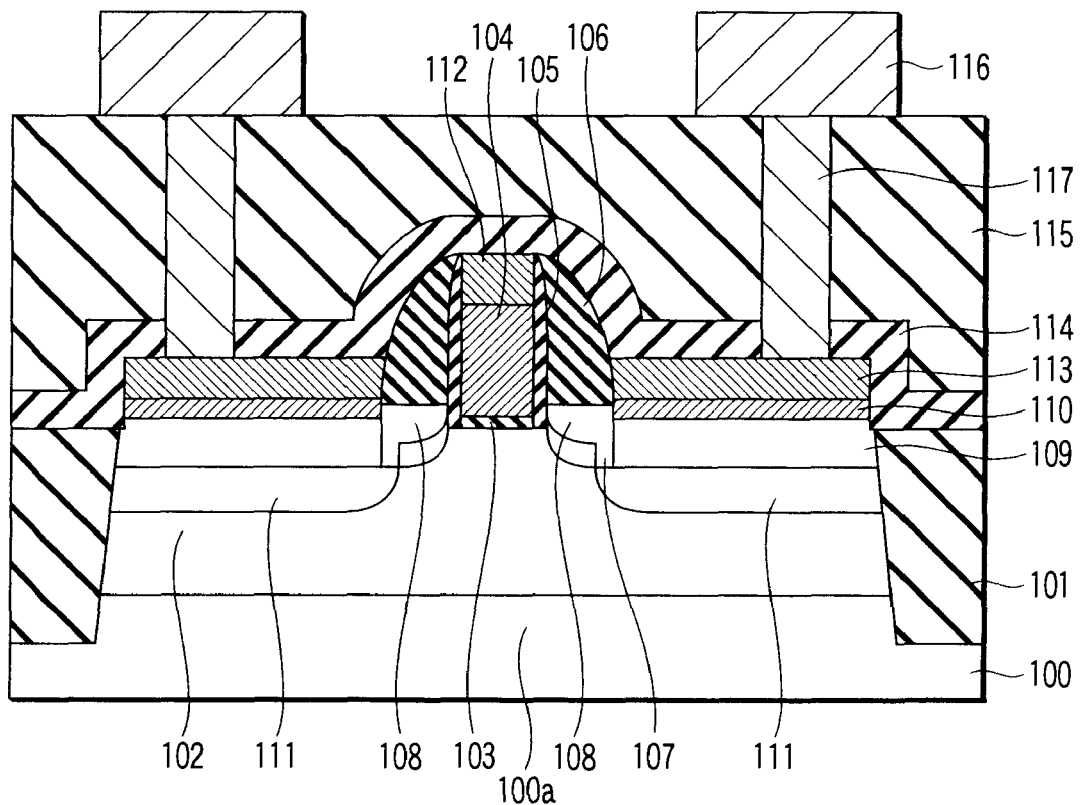

Subsequently, as shown in FIG. 13B, the barrier insulating film 114 is deposited on the structure depicted in FIG. 13A, and then the interlayer insulating layer 115 is deposited on the barrier insulating film 114 and flattened by, e.g., CMP (Chemical Mechanical Polishing). Further, a contact hole reaching the second source/drain layer 111 is formed in the interlayer insulating layer 115. Thereafter, the contact hole is filled with an electroconductive material to form a contact plug 117. Furthermore, the wiring layer 116 connected with the contact plug 117 is formed on the interlayer insulating layer 115. Subsequently, a process required for a semiconductor device, e.g., multilayer wiring is carried out, thereby manufacturing the semiconductor device according to this embodiment.

According to the semiconductor device of this embodiment, since the source/drain layers 108 and 111 contain the silicon germanium as a compound of silicon and germanium having a larger atomic radius than silicon, a compression stress can be given to the channel region, and a carrier mobility can be improved.

Moreover, in a conventional technology, in order to reduce a resistance of a source/drain layer using the silicon germanium, a silicide layer is formed on the source/drain layer. However, when the silicide layer directly comes into contact with the silicon germanium in the source/drain layer, a thermally unstable compound is generated. As a result, transistor characteristics may be deteriorated in some cases. Additionally, even if the surface layer of the source/drain layer containing the silicon germanium is constituted of a silicon layer having a fixed thickness and the silicide layer is formed on this silicon layer alone to suppress generation of a compound due to a reaction of the silicon germanium and the silicide layer, a contact resistance between the silicon layer and the silicide layer is increased. Therefore, an improvement in transistor characteristics may become insufficient.

On the other hand, in the semiconductor device according to this embodiment, in order to reduce resistances of the source/drain layers 108 and 111, the surface layer of the second source/drain layer 111 using the silicon germanium is constituted of the germanium layer 110 having a fixed thickness, and the germanide layer 113 is provided on the germanium layer 110 to avoid reaching the silicon germanium layer 109. As a result, the silicon germanium layer 109 of the second source/drain layer 111 does not directly come into contact with the germanide layer 113, and a thermally unstable compound is not produced, thereby avoiding deterioration in transistor characteristics. Further, since a contact resistance between the germanium layer 110 and the germanide layer 113 is lower than a contact resistance between the silicon layer and the silicide layer, deterioration in transistor characteristics can be effectively suppressed.

Therefore, according to the semiconductor device of this embodiment, a compression stress can be given to the channel region, a carrier mobility can be improved, and a resistance of the source/drain layer can be reduced without producing a thermally unstable compound on the source/drain layer. As a result, deterioration in transistor characteristics can be suppressed.

Modification 1 of Embodiment 2

Figure 14:
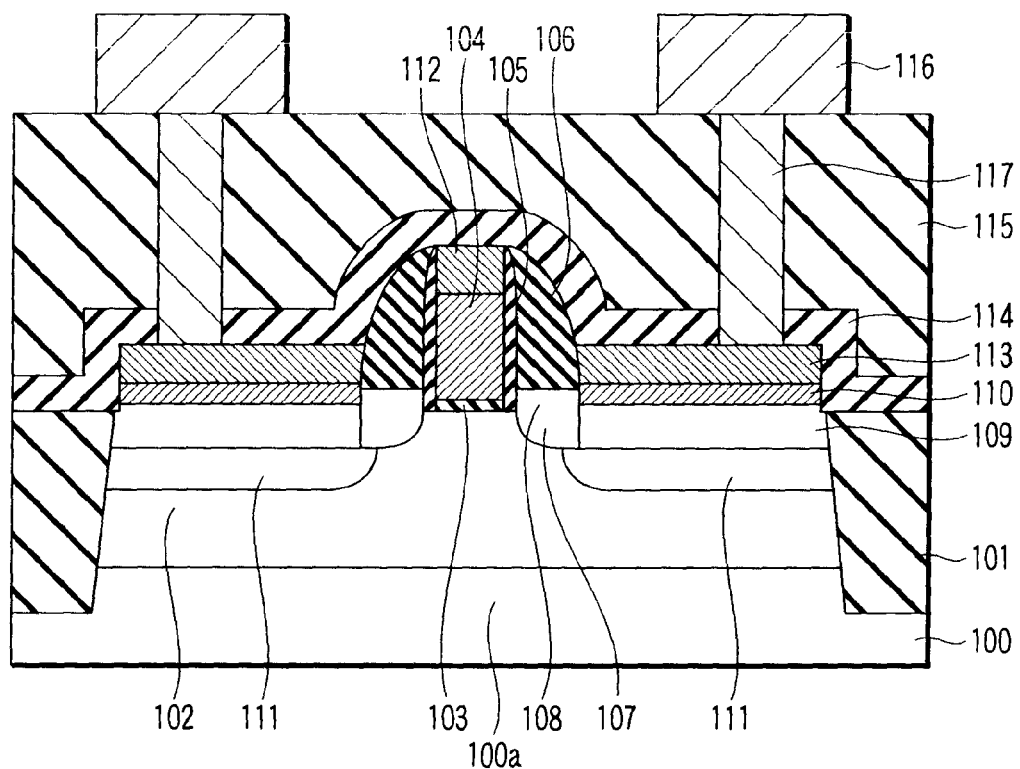
FIG. 14 is a cross-sectional view showing a semiconductor device according to Modification 1 of Embodiment 2 of the present invention.

FIG. 14 is a cross-sectional view of a semiconductor device according to Modification of Embodiment 2.

The semiconductor device according to this modification is different from the semiconductor device according to Embodiment 2 in that a thickness of a first source/drain layer 108 as an extension layer is substantially the same as a thickness of a semiconductor layer 107 below a second sidewall insulating film 106. Therefore, in the following description of the semiconductor device according to this modification, like reference numerals denote parts equal to those in the structure and the manufacturing method of the semiconductor device according to Embodiment 2, thereby omitting a detailed explanation thereof.

That is, a first source/drain layer 108 in a semiconductor device according to this modification is formed by doping, e.g., boron (B) simultaneously with selective epitaxial grow of a silicon germanium layer as a semiconductor layer 107. Therefore, as shown in FIG. 14, a thickness of the first source/drain layer 108 is substantially the same as a thickness of the silicon germanium layer 107.

According to the semiconductor device of this modification, like Embodiment 2, a compression stress can be given to a channel region, a carrier mobility can be improved, and a resistance of the source/drain layer can be reduced without producing a thermally unstable compound on the source/drain layer. As a result, deterioration in transistor characteristics can be suppressed.

Furthermore, in manufacture of the semiconductor device according to this modification, a process of implanting an ion into the semiconductor layer 107 can be omitted in manufacture of the semiconductor device according to Embodiment 2.

It is to be noted that boron (B) is doped simultaneously with selective epitaxial growth of the semiconductor layer 107 to form the first source/drain layer 108 in this modification. However, a second source/drain layer 111 may be likewise formed by doping boron (B) simultaneously with selective epitaxial growth of a silicon germanium layer 109 and a germanium layer 110.

Modification 2 of Embodiment 2

Figure 15:
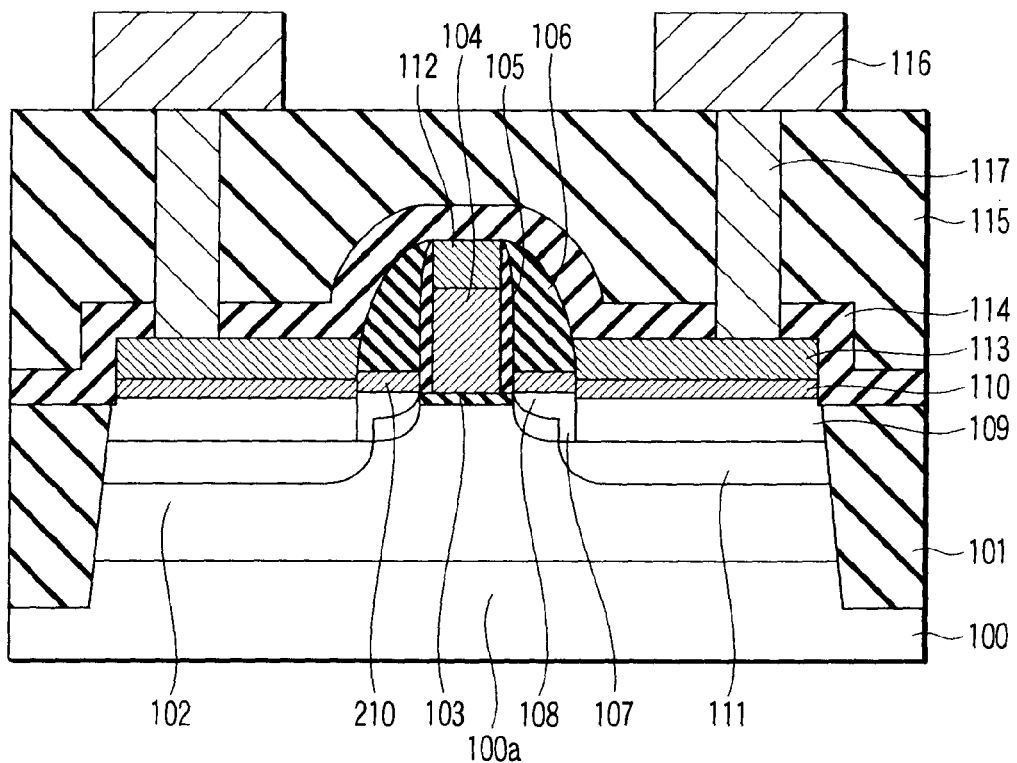
FIG. 15 is a cross-sectional view showing a semiconductor device according to Modification 2 of Embodiment 2 of the present invention.

FIG. 15 is a cross-sectional view of a semiconductor device according to Modification 2 of Embodiment 2.

A semiconductor device according to this modification is different from the semiconductor device according to Embodiment 2 in that a germanide layer 113 formed on a second source/drain layer 111 is in contact with a first source/drain layer 108 as an extension layer. Therefore, in the following description of the semiconductor device according to this modification, like reference numerals denote parts equal to those in the structure and the manufacturing method of the semiconductor device according to Embodiment 2, thereby omitting a detailed explanation thereof.

That is, as shown in FIG. 15, in the semiconductor device according to this modification, a metal film is formed on a second source/drain layer 111, and then a heat treatment is carried out to form a germanide layer 113. At this moment, the germanide layer 113 is formed to reach a position where it comes into contact with a germanium layer 210 constituting a first source/drain layer 108 formed in proximity to the second source/drain layer 111. It is to be noted that the second source/drain layer 111 likewise has a germanium layer 110 on an interface between itself and the germanide layer 113 in the semiconductor device according to this modification.

Moreover, in this modification, a contact portion of a semiconductor layer 107 with respect to the germanide layer 113 has a germanium layer 210 in order to prevent a thermally unstable ternary compound NiSiGe being formed on an interface between the germanide layer 113 and the semiconductor layer 107.

According to the semiconductor device of this modification, like the semiconductor device according to Embodiment 2, a compression stress can be given to a channel region, a carrier mobility can be improved, and a resistance of the source/drain layer can be reduced without producing a thermally unstable compound on the source/drain layer. As a result, deterioration in transistor characteristics can be suppressed.

Embodiment 3

Figure 16:
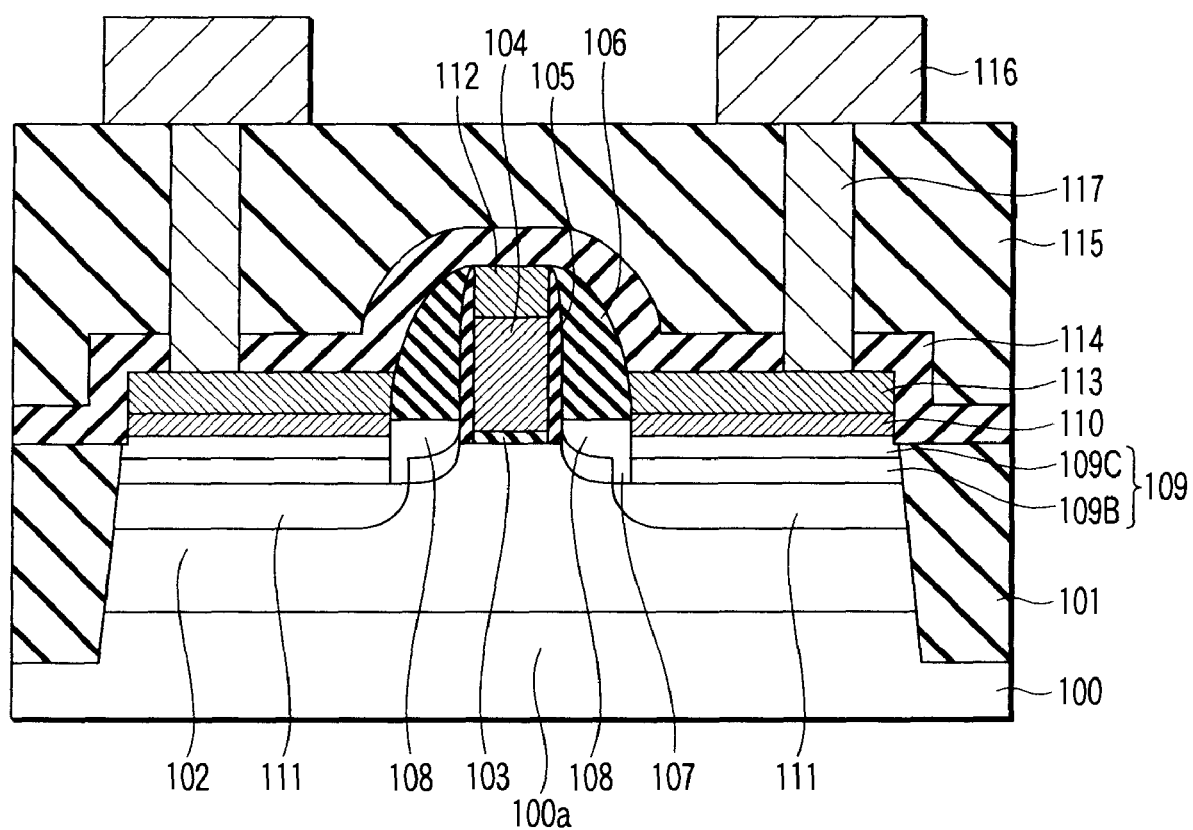
FIG. 16 is a cross-sectional view showing a semiconductor device according to Embodiment 3 of the present invention.

A structure of a semiconductor device according to Embodiment 3 will now be explained with reference to FIG. 16. FIG. 16 is a cross-sectional view of a semiconductor device according to this Embodiment.

The semiconductor device according to this embodiment is different from the semiconductor device according to Embodiment 2 in that a portion of a silicon germanium layer 109 on both sides of a second sidewall insulating film 106 on a side surface of a gate electrode 104 has a concentration gradient. Therefore, in the following description of this embodiment, like reference numerals denote parts equal to those in the structure and the manufacturing method of the semiconductor device according to Embodiment 2, thereby omitting a detailed explanation thereof.

As shown in FIG. 16, the silicon germanium layer 109 includes a silicon germanium layer 109B having a predetermined germanium concentration, and a silicon germanium layer 109C in which the germanium concentration increased toward the upper portion. The silicon germanium layer 109 of this structure is formed on a silicon substrate 100 on both sides of the second sidewall insulating film 106. Additionally, the germanium layer 110 is formed on the silicon germanium layer 109C. In this example, germanium concentrations in the silicon germanium layer 109B and the germanium layer 110 are 10 to 30 at % and approximately 100 at %, respectively. Further, the germanium concentration of the silicon germanium layer 109C is approximately 10 to 30 at % on an interface between the silicon germanium layer 109C and the silicon germanium layer 109B, and increased toward the upper portion. The germanium concentration of the silicon germanium layer 109C is approximately 100 at % on an interface between the silicon germanium layer 109C and the germanium layer 110.

Furthermore, a second source/drain layer 111 having an impurity ion implanted therein is formed with respect to this silicon germanium layer 109B, 109C, and the germanium layer 110. A germanide layer 113 is formed on the germanium layer 110 in order to reduce a resistance of the second source/drain layer 111.

A method of forming the silicon germanium layer 109B, 109C, and the germanium layer 110 in the semiconductor device according to this embodiment will now be explained.

First, like the manufacturing method of the semiconductor device according to Embodiment 2, a gate electrode 104, a first source/drain layer 108, and others are formed on the silicon substrate 100. Then, a groove 120 is formed in the silicon substrate on both sides of the second sidewall insulating film 106 formed on a side surface of the gate electrode 104.

Subsequently, the silicon germanium layer 109 is subjected to selective epitaxial growth in the groove 120. At this moment, like Embodiment 2, the silicon germanium layer 109B can be grown by adding hydrogen chloride (HCl) to hydrogen ($H_2$) as a carrier gas and performing heating with a mixed gas containing dichlorsilane ($SiH_2Cl_2$) and monogermane ($GeH_4$) being used as a raw material gas. A gas flow rate of $GeH_4$ with respect to $SiH_2Cl_2$ can be set to, e.g., 2 vol % to 5 vol %.

Moreover, after the silicon germanium layer 109B is subjected to selective epitaxial growth, the silicon germanium layer 109C is continuously subjected to selective epitaxial growth while gradually increasing a gas flow ratio of $GeH_4$ with respect to $SiH_2Cl_2$ to gradually raise a germanium concentration. At this time, the gas flow ratio of $GeH_4$ with respect to $SiH_2Cl_2$ is adjusted in such a manner that the germanium concentration of the silicon germanium layer 109C has a concentration gradient rising to approximately 100 at %.

Additionally, the germanium layer 110 whose germanium concentration becomes approximately 100 at % is continuously subjected to epitaxial growth in such a manner that this layer has a thickness of, e.g., approximately 30 nm.

In this manner, the silicon germanium layer 109B, 109C, and the germanium layer 110 in the semiconductor device according to this embodiment can be sequentially formed.

According to the semiconductor device of this embodiment, like the semiconductor device according to Embodiment 2, the silicon germanium is contained in the source/drain layers 108 and 111 to give a compression stress to a channel region and improve a carrier mobility. Further, the germanium layer is formed on the silicon germanium layer, and a high-melting point metal film is formed on this germanium layer to form the germanide layer. As a result, a thermally unstable compound is not produced on the source/drain layer. Therefore, a resistance of the source/drain layer can be reduced, and deterioration in transistor characteristics can be suppressed.

Furthermore, in the growth process of the silicon germanium layer 109 and the germanium layer 110 where the second source/drain layer 111 is formed in manufacture of the semiconductor device according to Embodiment 2, a gas flow ratio of $GeH_4$ with respect to $SiH_2Cl_2$ must be precipitously changed to grow the germanium layer 110 on the silicon germanium layer 109. On the other hand, in the growth process of the silicon germanium layer 109B, 109C, and the germanium layer 110 where the second source/drain layer 111 is formed in manufacture of the semiconductor device according to this embodiment, the silicon germanium layer 109B, 109C, and the germanium layer 110 are continuously grown while gradually increasing a gas flow ratio of $GeH_4$ with respect to $SiH_2Cl_2$, thereby forming the second source/drain layer 111. Therefore, manufacture is simple.

Figure 17:
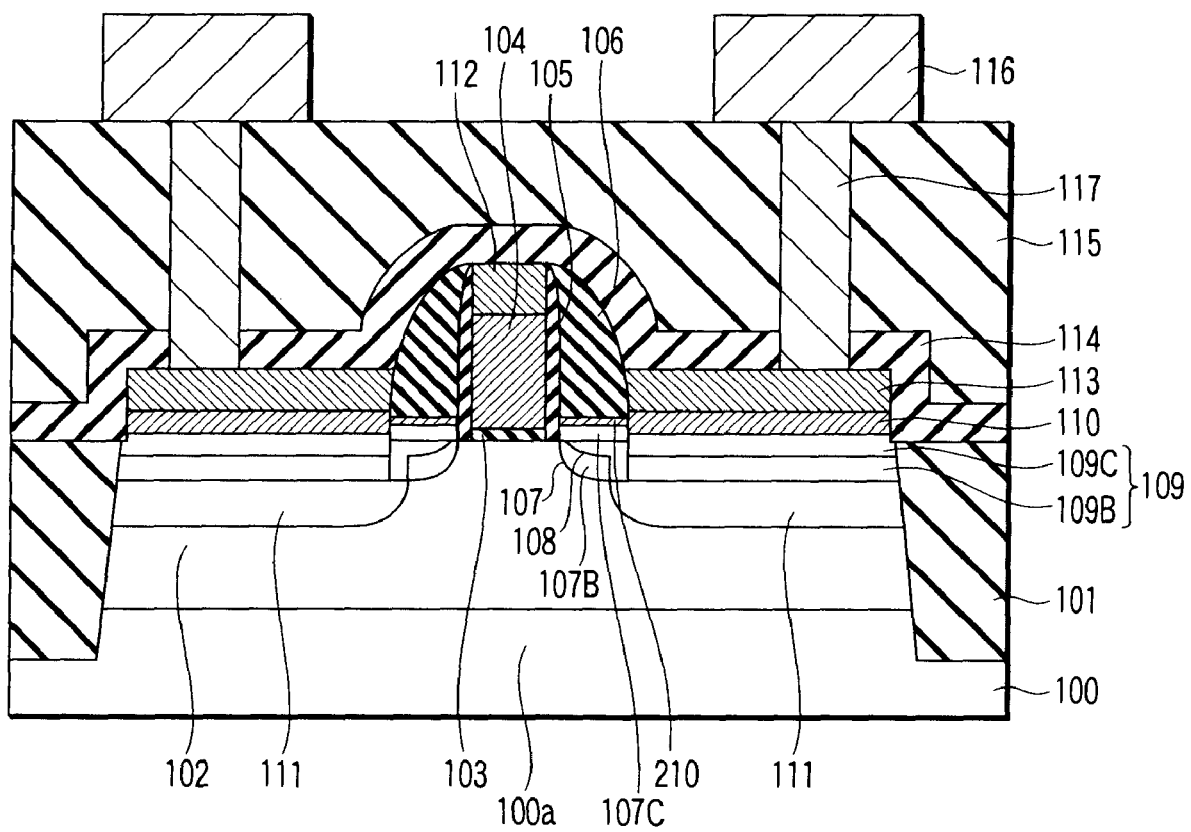
FIG. 17 is a cross-sectional view showing a semiconductor device according to Modification of Embodiment 3 of the present invention.

Embodiment 3 may be modified as shown in FIG. 17. That is, the semiconductor layer 107 shown in FIG. 16 may include a silicon germanium layer 107B, a silicon germanium layer 107C having a concentration gradient, and the germanium layer 210. In addition, boron (B) may be introduced when the silicon germanium layer is formed.

Moreover, the present invention is not restricted to each of the foregoing embodiments or the modifications, and can be modified and carried out in many ways within a scope of the present invention.

For example, in the semiconductor device according to each of Embodiment 2, each modification, and Embodiment 3, the surface of the first source/drain layer 108 or the surface of the second source/drain layer 111 is placed at a height above the surface of the silicon substrate 100, but it may be placed at a height equal to or below the surface of the silicon substrate 100. Additionally, in the semiconductor device according to each of Embodiment 2, each modification, and Embodiment 3, the silicon germanium layer is used for the semiconductor layer 107, but a silicon layer may be used as any other material, for example.

Further, in the second source/drain layer 111 of the semiconductor device according to each of the foregoing embodiments or each of the modifications, the germanium layer 110 is directly formed on the silicon germanium layer 109, but the germanium layer 110 may be formed on the silicon germanium layer 109 via, e.g., a silicon layer.

According to the embodiments of the present invention, it is possible to provide the semiconductor device that improves a carrier mobility and suppresses deterioration in transition characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a gate insulating film formed on the semiconductor substrate;
   a gate electrode formed on the gate insulating film;
   a first sidewall insulating film formed on a side surface of the gate electrode;
   a source/drain layer formed on both sides of the gate electrode, the source/drain layer including a silicon germanium layer and an extension layer, the extension layer being formed on the semiconductor substrate below the first sidewall insulating film, the extension layer being arranged between the silicon germanium layer and a channel region below the gate insulating film;
   a germanium layer including a first portion and a second portion, the first portion being disposed between the first sidewall insulating film and the extension layer, a bottom surface of the first portion contacting a top surface of the extension layer, and a top surface of the first portion contacting a bottom surface of the first sidewall insulating film, and the second portion being disposed on the silicon germanium layer; and
   a germanide layer contacting the second portion of the germanium layer.

2. The semiconductor device according to claim 1, wherein a germanium concentration of the silicon germanium layer is not lower than 10 at %.

3. The semiconductor device according to claim 1, wherein the germanide layer is in contact with the first sidewall insulating film.

4. The semiconductor device according to claim 1, wherein a bottom of the first portion of the germanium layer is in contact with the extension layer.

5. The semiconductor device according to claim 1, wherein the germanide layer contains one of a nickel germanide layer, a cobalt germanide layer, a titanium germanide layer, an iridium germanide layer, a platinum germanide layer, and a palladium germanide layer.

6. The semiconductor device according to claim 1, wherein the source/drain layer containing the silicon germanium layer gives a compression stress to the channel region below the gate insulating film.

7. The semiconductor device according to claim 6, wherein the channel region forms a channel of a p-channel MOS field effect transistor.

8. The semiconductor device according to claim 1, further comprising a second sidewall insulating film formed on a side surface of the first sidewall insulating film, the second sidewall insulating film contacting a top surface of the germanide layer.

9. The semiconductor device according to claim 1, further comprising an element isolation region,
   wherein one end of the source/drain layer contacts the element isolation region, and the semiconductor substrate contacts the silicon germanium layer.

* * * * *